United States Patent
Huang et al.

(10) Patent No.: US 8,373,466 B1
(45) Date of Patent: Feb. 12, 2013

(54) FREQUENCY LOCKING METHOD, FREQUENCY LOCKING CIRCUIT, OSCILLATOR GAIN ANTICIPATING METHOD AND OSCILLATOR GAIN ANTICIPATING CIRCUIT

(75) Inventors: Yen-Yin Huang, Taoyuan County (TW); Ken-Yi Pan, New Taipei (TW); Ming-Shih Yu, New Taipei (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/313,017

(22) Filed: Dec. 7, 2011

(51) Int. Cl.
*H03L 7/06* (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| | | | |
|---|---|---|---|
| 7,778,610 B2 * | 8/2010 | Staszewski et al. ............ | 455/76 |
| 7,999,583 B2 * | 8/2011 | Rhee et al. .................... | 327/156 |
| 2008/0069286 A1 * | 3/2008 | Staszewski et al. ........... | 375/376 |
| 2009/0262877 A1 * | 10/2009 | Shi et al. ........................ | 375/376 |
| 2010/0321074 A1 * | 12/2010 | Song .............................. | 327/157 |
| 2011/0221487 A1 * | 9/2011 | Lesso ............................. | 327/147 |
| 2012/0038400 A1 * | 2/2012 | Talaga, Jr. ..................... | 327/156 |

* cited by examiner

*Primary Examiner* — Adam Houston
(74) *Attorney, Agent, or Firm* — Winston Hsu; Scott Margo (57) ABSTRACT

A frequency locking method, for locking an output signal outputted from a frequency locking circuit to a target frequency, comprising: (a) detecting an output frequency of the output signal, wherein the output signal is generated according to an oscillating frequency of a controllable oscillator; (b) computing a frequency difference between the output frequency and the target frequency; (c) utilizing a controllable factor adjusting device to provide and to adjust a normalization factor according to the frequency difference, to anticipate a gain of the controllable oscillator and to provide a control signal related with the normalization factor and the frequency difference, wherein the output frequency is related with a product of the normalization factor and the gain of the controllable oscillator; and (d) controlling the controllable oscillator according to the control signal, such that the output frequency approaches to the target frequency.

26 Claims, 7 Drawing Sheets

FREQUENCY LOCKING METHOD, FREQUENCY LOCKING CIRCUIT, OSCILLATOR GAIN ANTICIPATING METHOD AND OSCILLATOR GAIN ANTICIPATING CIRCUIT

BACKGROUND OF THE INVENTION

1. Field of the Invention

The present invention relates to a frequency locking method and a frequency locking circuit, and particularly relates to a frequency locking method and a frequency locking circuit, which adjusts a normalization factor such that the product of a normalization factor and an oscillator gain approaches to a predetermined produce. The present invention also relates to an oscillator gain anticipating method and an oscillator gain anticipating circuit.

2. Description of the Prior Art

Figure 1:
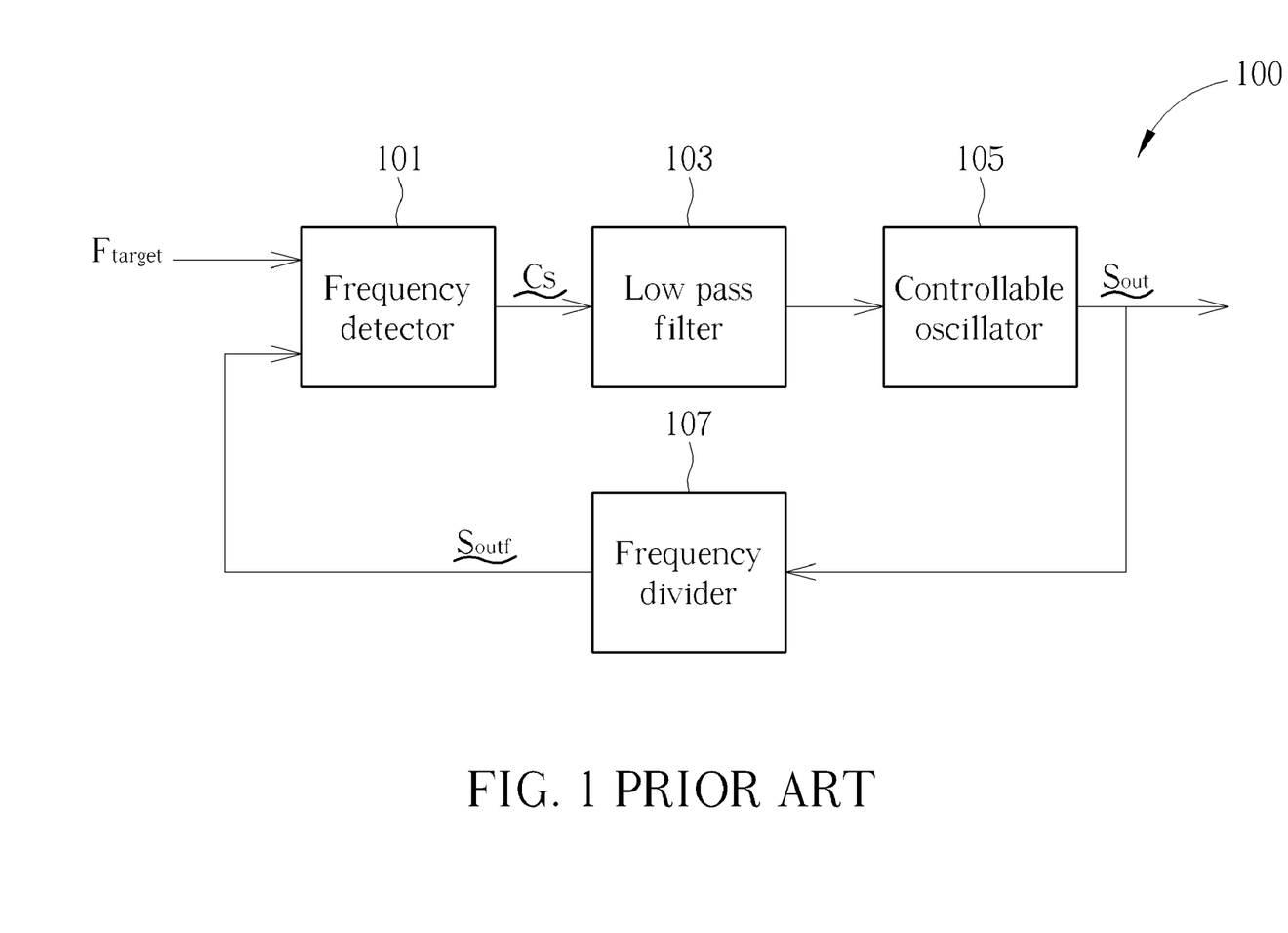
FIG. 1 is a block diagram illustrating a prior art frequency locking circuit.

FIG. 1 is a block diagram illustrating a prior art frequency locking circuit 100. As shown in FIG. 1, the frequency locking circuit 100 includes a frequency detector 101, a low pass filter 103, a controllable oscillator 105 and a frequency divider 107. The output signal $S_{out}$ is frequency-divided by the frequency divider 107 to generate a frequency-divided output signal $S_{outf}$. Then the frequency-divided output signal $S_{outf}$ is transmitted to the frequency detector 101. The frequency divider 101 transmits a control signal CS after comparing a frequency of the frequency-divided output signal $S_{outf}$ and a target frequency $F_{target}$. The control signal CS is filtered by the low pass filter 103 and then be transmitted to the controllable oscillator 105 to adjust the output signal $S_{out}$. By this way, the frequency-divided output signal $S_{outf}$ is locked to the target frequency $F_{target}$, that is, the output signal $S_{out}$ is locked to N times $F_{target}$ (N is the frequency dividing ratio of the frequency divider 107).

If the output signal $S_{out}$ is desired to be quickly locked, a popular method is to increase the bandwidth of the low pass filter 103, or to utilize an extra oscillator gain calibrator to acquire the oscillator gain. The first method causes the difficulty to restrain low frequency noise. The second method, such as the concept shown in U.S. Pat. Nos. 6,894,570 and 6,459,253, needs long calibration time, complicated computing method and a larger circuit area.

In view of above-mentioned embodiments, the output signal frequency can be rapidly adjusted without adding a pre controllable oscillator gain anticipating circuit and changing the bandwidth. Besides, the oscillator gain can be acquired in the background mode, Additionally, since the gain of the controllable oscillator is detected in the background mode, the output frequency can rapidly approach to the target frequency, and the drift for oscillator gain can be compensated due to temperature variation. Moreover, the advantage that the loop bandwidth value is fixed is also provided, such that the loop bandwidth can avoid the effect from process variation.

SUMMARY OF THE INVENTION

Therefore, one objective of the present invention is to provide a frequency locking method and a frequency locking circuit that do not affect the bandwidth.

Another objective of the present invention is to provide a frequency locking method and a frequency locking circuit for fast locking.

Another objective of the present invention is to provide a fast oscillator gain anticipating method and gain anticipating circuit operating in the background mode.

One embodiment of the present invention discloses a frequency locking method, for locking an output signal outputted from a frequency locking circuit to a target frequency, comprising: (a) detecting an output frequency of the output signal, wherein the output signal is generated according to an oscillating frequency of a controllable oscillator; (b) computing a frequency difference between the output frequency and the target frequency; (c) utilizing a controllable factor adjusting device to provide and to adjust a normalization factor according to the frequency difference, to anticipate a gain of the controllable oscillator and to provide a control signal related with the normalization factor and the frequency difference, wherein the output frequency is related with a product of the normalization factor and the gain of the controllable oscillator; and (d) controlling the controllable oscillator according to the control signal, such that the output frequency approaches to the target frequency.

Another embodiment of the present invention discloses a frequency locking circuit, comprising: a controllable oscillator, for generating an oscillating signal; a frequency detector, for detecting an output frequency of the output signal and for computing a frequency difference between the output frequency and a target frequency; a controllable factor adjusting device, for providing a normalization factor, to anticipate a gain of the controllable oscillator and to provide a control signal related with the normalization factor and the frequency difference, wherein the output frequency is related with a product of the normalization factor and the gain of the controllable oscillator; and a controller, for adjusting the normalization factor according to the frequency difference; wherein the controllable oscillator adjusts the output frequency according to the control signal and the controller adjusts the normalization factor, such that the output frequency approaches to the target frequency.

Another embodiment of the present invention discloses an oscillator gain anticipating method, comprising: (a) detecting an output frequency of an output signal, wherein the output signal is generated according to an oscillating frequency of a controllable oscillator; (b) computing a frequency difference between the output frequency and a target frequency; (c) utilizing a controllable factor adjusting device to provide a normalization factor, wherein the output frequency is related with a product of the normalization factor and the gain of the controllable oscillator; and (d) adjusting the normalization factor, and anticipating a gain of the controllable oscillator according to a relation between the normalization factor and the frequency difference.

Another embodiment of the present invention discloses an oscillator gain anticipating circuit, comprising: a controllable oscillator, for generating an oscillating signal; a frequency detector, for detecting an output frequency of the output signal generated according to the oscillating signal and for computing a frequency difference between the output frequency and the target frequency; a controllable factor adjusting device, for providing a normalization factor, wherein the output frequency is related with a product of the normalization factor and the gain of the controllable oscillator; and a controller, for adjusting the normalization factor according to the frequency difference, and for anticipating a gain of the controllable oscillator according to a relation between the normalization factor and the frequency difference.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 2A:
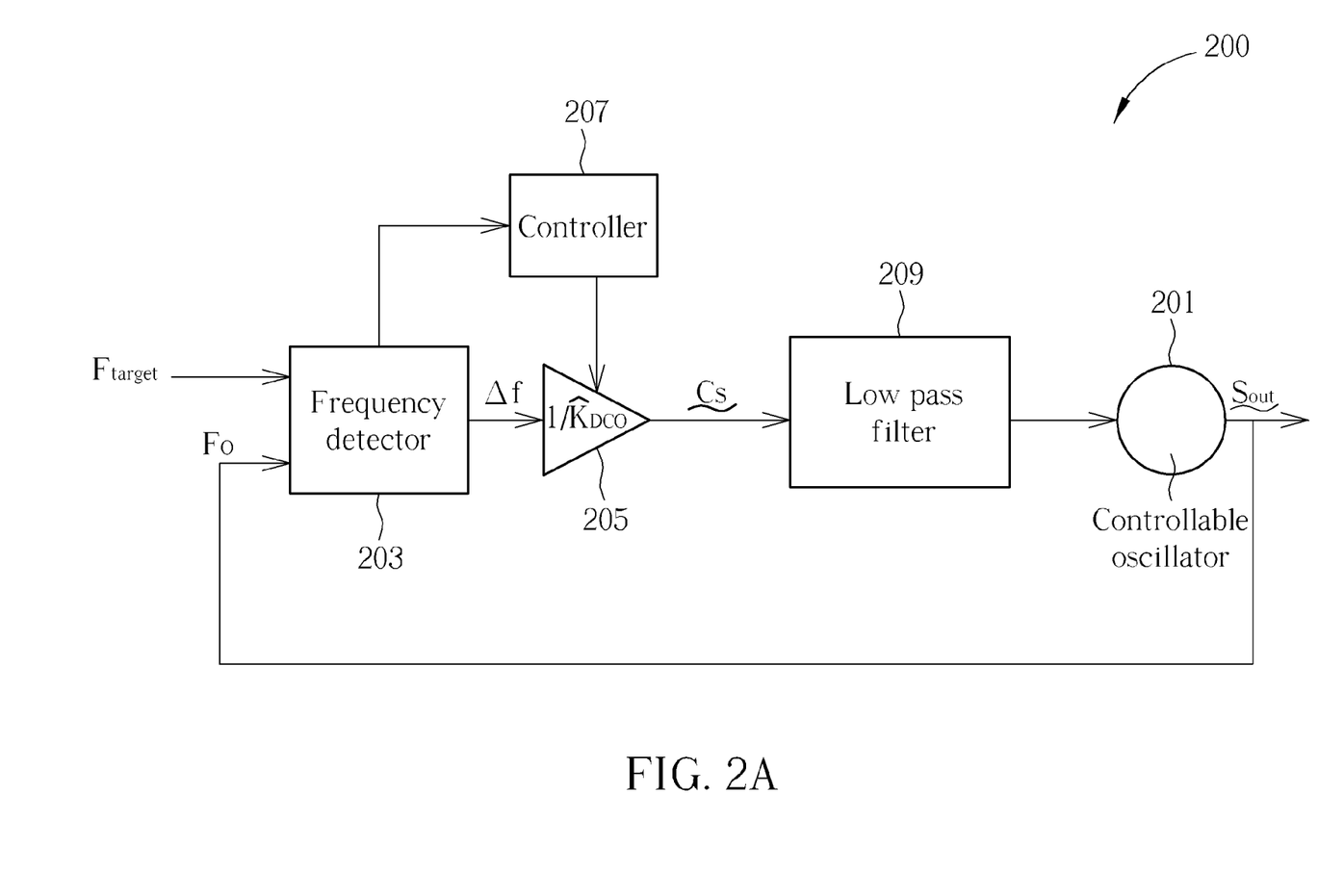
FIGS. 2A and 2B are circuit diagrams illustrating a frequency locking circuit according to one embodiment of the present invention.

FIG. 2A is a circuit diagram illustrating a frequency locking circuit 200 according to one embodiment of the present invention. As shown in FIG. 2A, the frequency locking circuit 200 includes a controllable oscillator 201, a frequency detector 203, a controllable factor adjusting device 205 and a controller 207. The oscillator 201 generates an output signal $S_{out}$. The frequency detector 203 detects an output frequency ($F_o$) of the output signal $S_{out}$ and for computing a frequency difference $\Delta f$ between the output frequency and a target frequency $F_{target}$. It should be noted that, the oscillating signal from the controllable oscillator 201 is directly utilized as the output signal $S_{out}$ to explain this embodiment. However, the output signal $S_{out}$ can be produced by frequency-dividing the oscillating signal (ex. using the frequency divider 107 in FIG. 1). Such variation should also be included in the scope of the present invention.

The controllable factor adjusting device 205 provides a normalization factor $$\left(\frac{1}{\hat{K}_{DCO}}\right)$$

to cooperate with the controllable oscillator 201 with a gain $K_{DCO}$ to adjust the output frequency. The controller 207 adjusts the normalization factor $$\frac{1}{\hat{K}_{DCO}}$$

according to the frequency difference $\Delta f$. In this embodiment, the frequency detector 203 successively detects the frequency difference between the adjusted output frequency and the target frequency, and the controller 207 controls the controllable factor adjusting device 205 to successively increase or decrease the normalization factor $$\frac{1}{\hat{K}_{DCO}}.$$

Such that the control signal CS from the controllable factor adjusting device 205 is adjusted, thereby the output frequency $F_o$ approaches to the target frequency $F_{target}$ (i.e. the product of $$\frac{1}{\hat{K}_{DCO}}$$

and $K_{DCO}$ is 1). The frequency locking circuit 200 can further include a low pass filter 209, thereby the control signal transmitted to the oscillator 201 can be more stable.

Figure 2B:
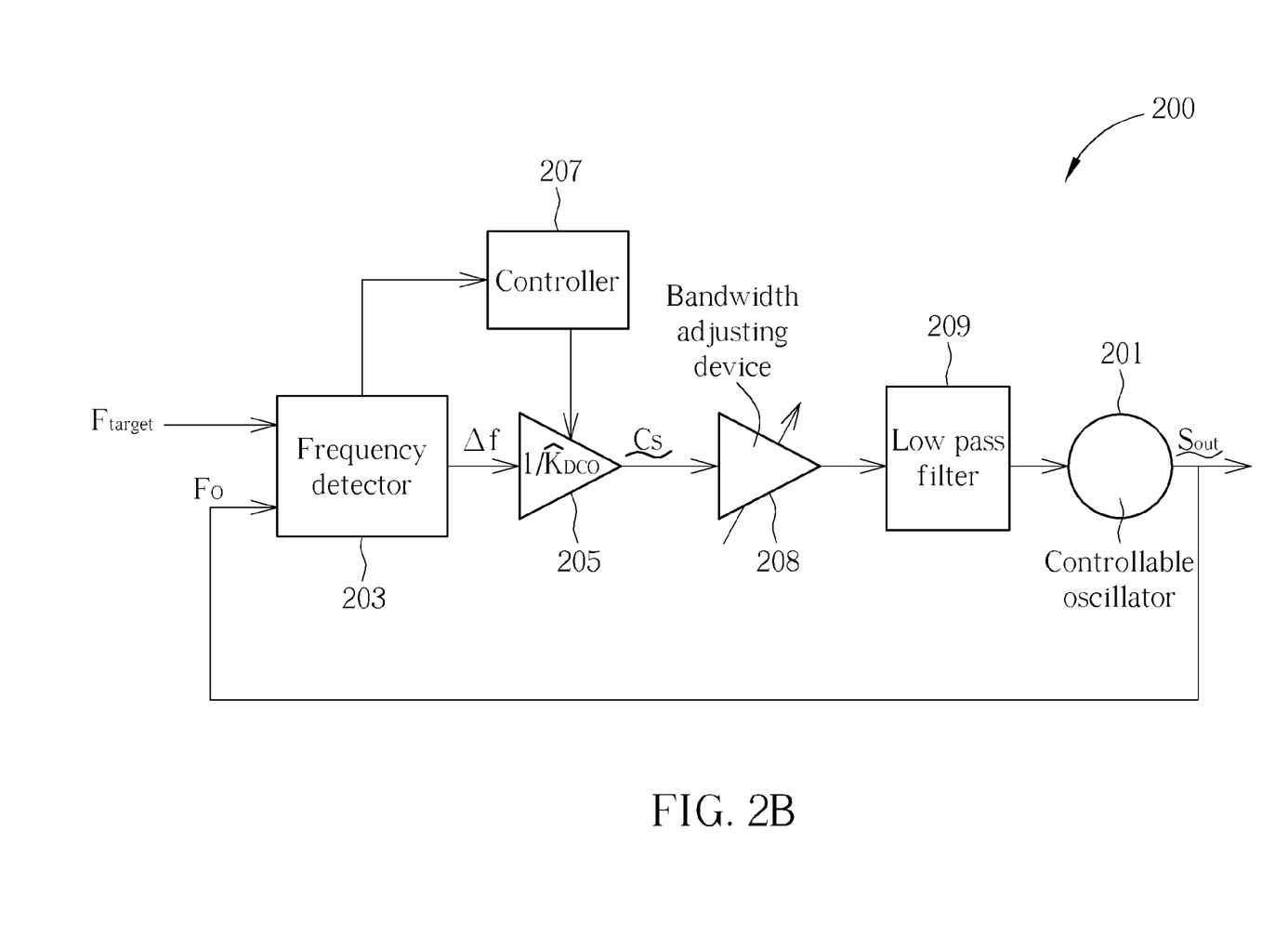

The operation of the frequency locking circuit 200 shown in FIG. 2A is detailedly illustrated as follows. The output frequency in FIGS. 2A and 2B can be shown as Equation (1):

$$f_{o,n} = f_{o,n-1} + \Delta f \times \frac{1}{\hat{K}_{DCO}} \times K_{DCO} = \quad \text{Equation (1)}$$

$$f_{o,n-1} + (f_{target} - f_{o,n-1}) \times \frac{1}{\hat{K}_{DCO}} \times K_{DCO} =$$

$$f_{target} \; (\text{if } \hat{K}_{DCO} = K_{DCO})$$

$f_{o,n}$ indicates the output frequency of the current period, $f_{o,n-1}$ indicates the output frequency of the previous period, and $f_{target}$ indicates the target frequency.

$$\frac{1}{\hat{K}_{DCO}}$$

indicates the factor of the controllable factor adjusting device 205, and $K_{DCO}$ is the gain of the controllable oscillator 201. Based on Equation (1), if $$\frac{1}{\hat{K}_{DCO}}$$

can be adjusted to a reciprocal of $K_{DCO}$, the output frequency $f_{o,n}$ can be locked to the target frequency $f_{target}$.

Figure 3:
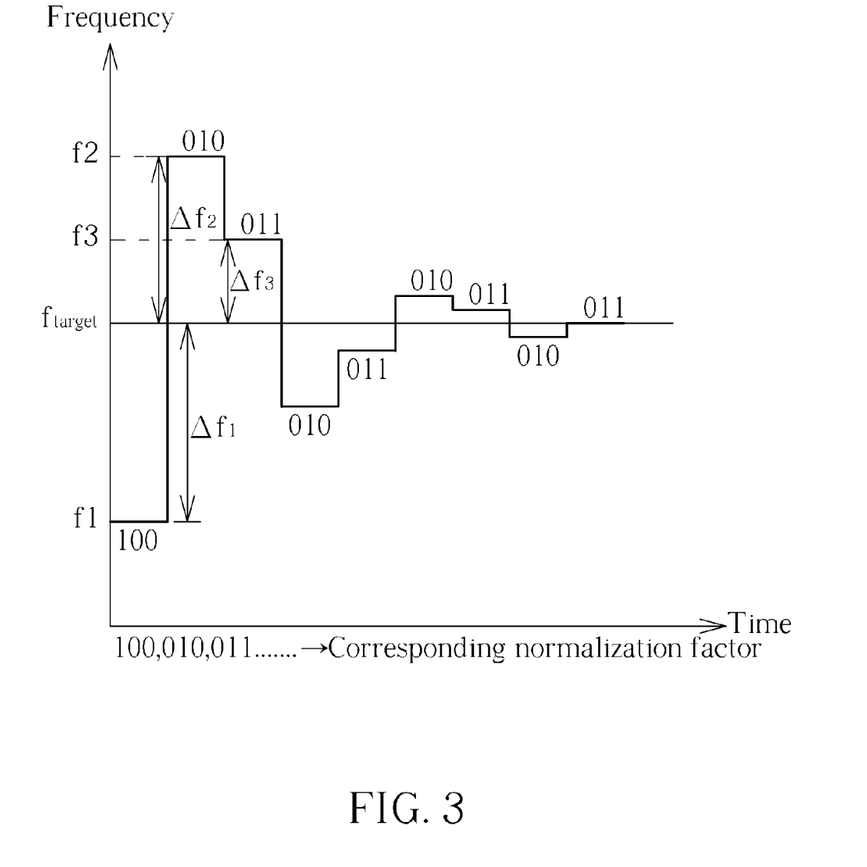
FIG. 3 is a schematic diagram illustrating a controlling operation for controlling the normalization factor shown in FIG. 2.

FIG. 3 is a schematic diagram illustrating a controlling operation for controlling the normalization factor shown in FIG. 2A. Based on Equation (1), the following equations can be acquired:

$$(f_{target} - f_1) = err_1 \quad f_2 = f_1 + err_1 \times \frac{1}{\hat{K}_{DCO,1}} \times K_{DCO}$$

$$(f_{target} - f_2) = err_2 \quad f_3 = f_2 + err_2 \times \frac{1}{\hat{K}_{DCO,2}} \times K_{DCO}$$

$$(f_{target} - f_{n-1}) = err_{n-1} \quad f_n = f_{n-1} + err_{n-1} \times \frac{1}{\hat{K}_{DCO,n-1}} \times K_{DCO}$$

In view of FIG. 3, when the frequency difference $err_1$ between the initial output frequency $f_1$ and the target frequency $f_{target}$ is detected, the normalization factor is adjusted to $$\frac{1}{\hat{K}_{DCO,1}},$$

to generate a new output frequency $f_2$. The difference between the output frequency $f_2$ and the target frequency $f_{target}$ is less than which of the output frequency $f_1$ and the target frequency $f_{target}$. Also, if a frequency difference $err_2$ still exists between the output frequency $f_2$ and the target frequency $f_{target}$, the normalization factor is adjusted to $$\frac{1}{\hat{K}_{DCO,2}},$$

to generate a new output frequency $f_3$. The difference between the output frequency $f_3$ and the target frequency $f_{target}$ is less than which of the output frequency $f_2$ and the target frequency $f_{target}$. Following this rule, $$\frac{1}{\hat{K}_{DCO}}$$

is continuously adjusted until the output frequency and the target frequency $f_{target}$ is the same or until the difference between the output frequency and the target frequency $f_{target}$ is less than a predetermined value (ex. a minimum frequency difference that the controllable oscillator can change). That is, the output frequency is successively adjusted, such that it can gradually approach to the target frequency and $$\frac{1}{\hat{K}_{DCO}} \times K_{DCO}$$

is locked to 1. In another embodiment, $$\frac{1}{\hat{K}_{DCO}},$$

can be continuously adjusted to fix the variation of the oscillator gain during the operation. It should be noted that although $$\frac{1}{\hat{K}_{DCO}} \times K_{DCO}$$

is locked to 1 in this embodiment, but it also can be set to lock to other predetermined products. Persons skilled in the art can understand that the function for approaching the target frequency can also be reached by this way.

Figure 4:
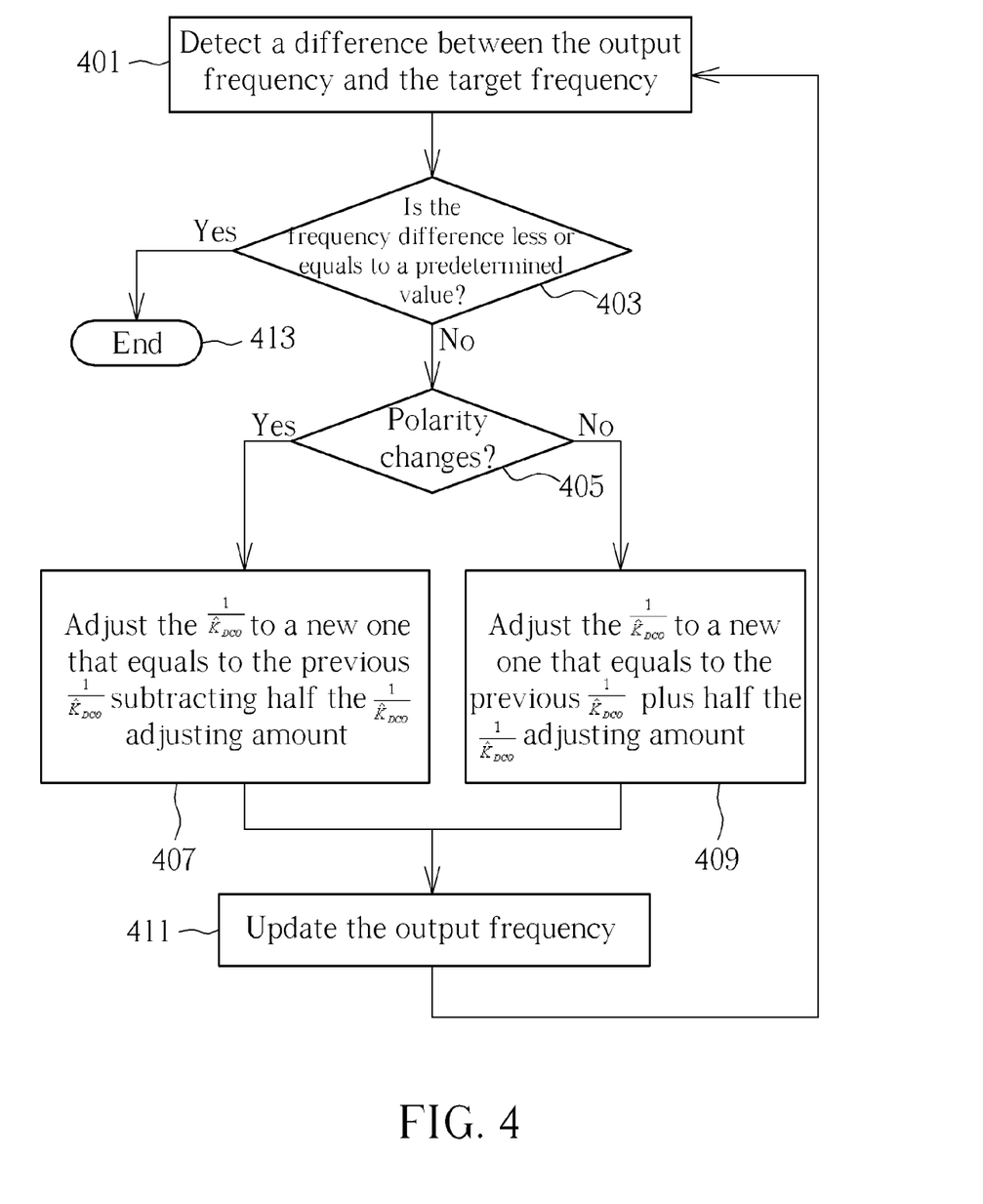
FIG. 4 is an example for adjusting the normalization factor shown in FIGS. 2A and 2B.

In another embodiment, the adjusting amount of $$\frac{1}{\hat{K}_{DCO}}$$

can be determined according to if a polarity changes or not (i.e. if the output frequency is larger or smaller than the target frequency), as shown in FIG. 4.

FIG. 4 is an example for adjusting the normalization factor shown in FIGS. 2A and 2B. The following steps are included:

Step 401
Detect a difference between the output frequency and the target frequency.

Step 403
Determine whether the frequency difference is less or equals to a predetermined value. If yes, it indicates that the output frequency is locked to the target frequency, thus go to step 413. If not, go to step 405 and perform following processes.

Step 405
Determine whether the polarity changes or not. If yes, that means $$\frac{1}{\hat{K}_{DCO}}$$

is over adjusted, thus go back to the step 407 to decrease it. If not, that means $$\frac{1}{\hat{K}_{DCO}}$$

can be further increased to approach to the target frequency more closely, thus go back to step 409 to increase it.

Step 407
Adjust the $$\frac{1}{\hat{K}_{DCO}}$$

to a new one that equals to the previous $$\frac{1}{\hat{K}_{DCO}}$$

subtracting half the $$\frac{1}{\hat{K}_{DCO}}$$

adjusting amount (or called variation amount).

Step 409
Adjust the $$\frac{1}{\hat{K}_{DCO}}$$

to a new one that equals to the previous $$\frac{1}{\hat{K}_{DCO}}$$

plus half the $$\frac{1}{\hat{K}_{DCO}}$$

adjusting amount.

Step 411
Update the output frequency according to the $$\frac{1}{\hat{K}_{DCO}}.$$

Step 413
END.

It should be noted that the steps 403 and the step 413 can be removed from the flow chart shown in FIG. 4. That is, the steps 401, 405, 407, 409 and 411 can be repeated such that the output frequency can gradually approach desired output frequency, thereby the output frequency can be maintained at an accurate value.

The flow chart in FIG. 4 can be summarized as follows: (a) detecting an output frequency of the output signal, wherein the output signal is generated according to an oscillating frequency of a controllable oscillator; (b) computing a frequency difference between the output frequency and the target frequency; (c) utilizing a controllable factor adjusting device to provide and to adjust a normalization factor according to the frequency difference, to anticipate a gain of the controllable oscillator and to provide a control signal related with the normalization factor and the frequency difference, wherein the output frequency is related with a product of the normalization factor and the gain of the controllable oscillator; and (d) controlling the controllable oscillator according to the control signal, such that the output frequency approaches to the target frequency. It should be noted that each variation amount for the normalization factor is not limited to above-mentioned steps 407 and 409. The variation amount can be a predetermined value or other values computed by other mathematic equations.

In view of above-mentioned embodiments, an oscillator gain anticipating method can also be acquired besides the above-mentioned frequency locking method. The oscillator gain anticipating method can include the following steps: (a) detecting an output frequency of an output signal, wherein the output signal is generated according to an oscillating frequency of a controllable oscillator; (b) computing a frequency difference between the output frequency and a target frequency; (c) utilizing a controllable factor adjusting device to provide a normalization factor, wherein the output frequency is related with a product of the normalization factor and the gain of the controllable oscillator; and (d) adjusting the normalization factor, and anticipating a gain of the controllable oscillator according to a relation between the normalization factor and the frequency difference.

The oscillator gain anticipating method can be performed by the circuit shown in FIG. 2A. That is, after the frequency detector 203 detects the difference between the output frequency $F_o$ and the target frequency $F_{target}$ the information will be transmitted to the controller 207. Since the controller 207 is responsible for adjusting the normalization factor $$\frac{1}{\hat{K}_{DCO}},$$

thus it acquires the information of the normalization factor $$\frac{1}{\hat{K}_{DCO}}$$

and the frequency difference. The gain of the controllable oscillator 201 can be anticipated via continuously adjusting $$\frac{1}{\hat{K}_{DCO}}$$

and the above-mentioned Equation (1). The frequency locking circuit 200 shown in FIG. 2A can further include a mechanism for adjusting the bandwidth. As shown in FIG. 2B, the frequency locking circuit 200 further includes a bandwidth adjusting device 208, which is located between the controllable factor adjusting device 205 and the low pass filter 209. However, the bandwidth adjusting device 208 can also be provided to other locations. The bandwidth adjusting device 208 can provide a dynamic bandwidth during the frequency locking process (i.e. approaches the output frequency to the target frequency), such that the frequency locking circuit 200 can operate in different manners during the process for frequency locking and normalization factor adjusting. Besides, the bandwidth adjusting device can be implemented by various kinds of circuits or devices. For example, if the signal to be processed is a digital signal, it can be implemented by a scaler. Also, if the signal is an analog signal, it can be implemented by a current mirror. The mechanism for adjusting the bandwidth can be independent from the controllable factor adjusting device, such that the adjusting for the circuit is more flexible.

Figure 5:
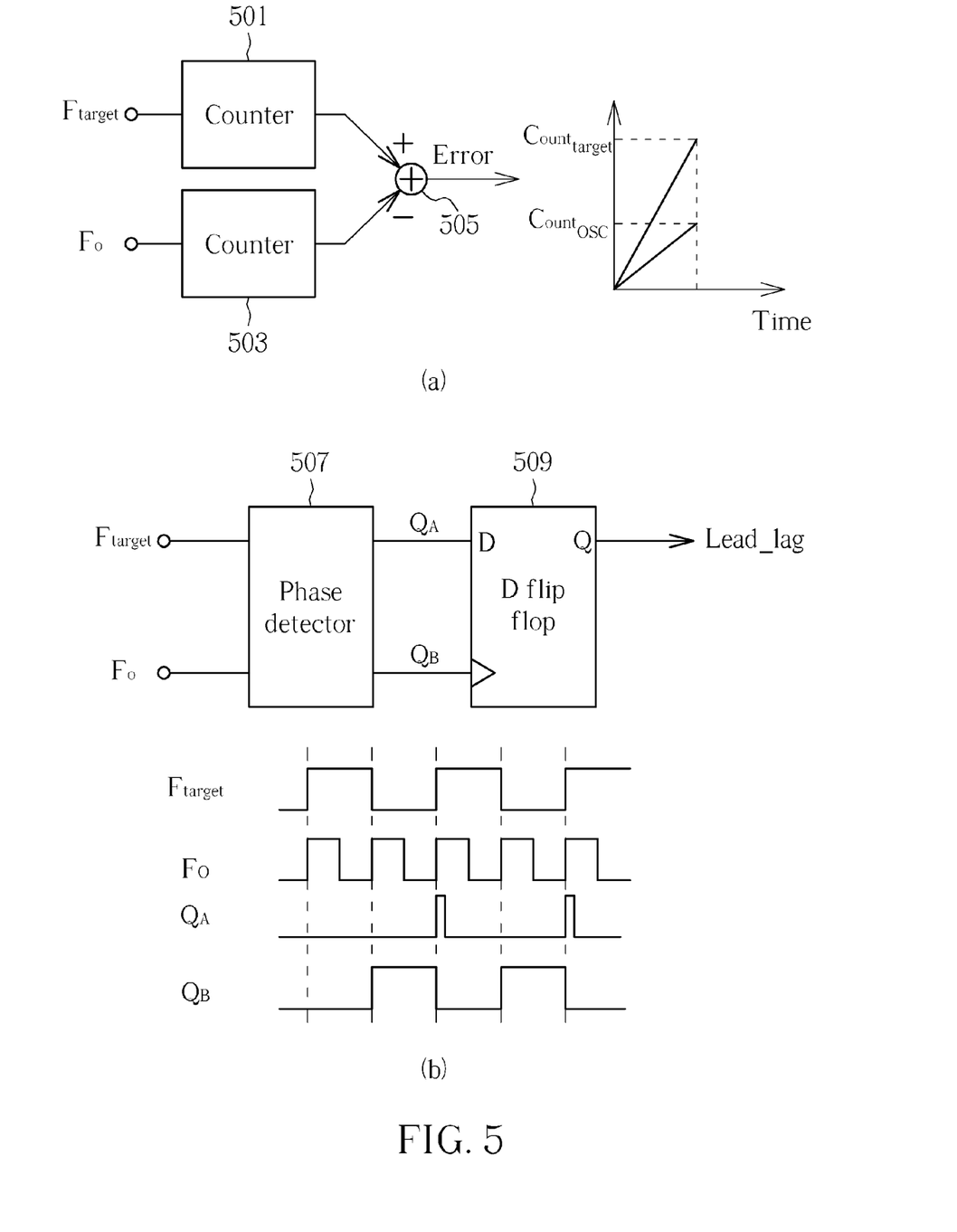
FIGS. 5 and 6 are exemplary embodiments for the frequency detector in the frequency locking circuit shown in FIGS. 2A and 2B.
Figure 6:
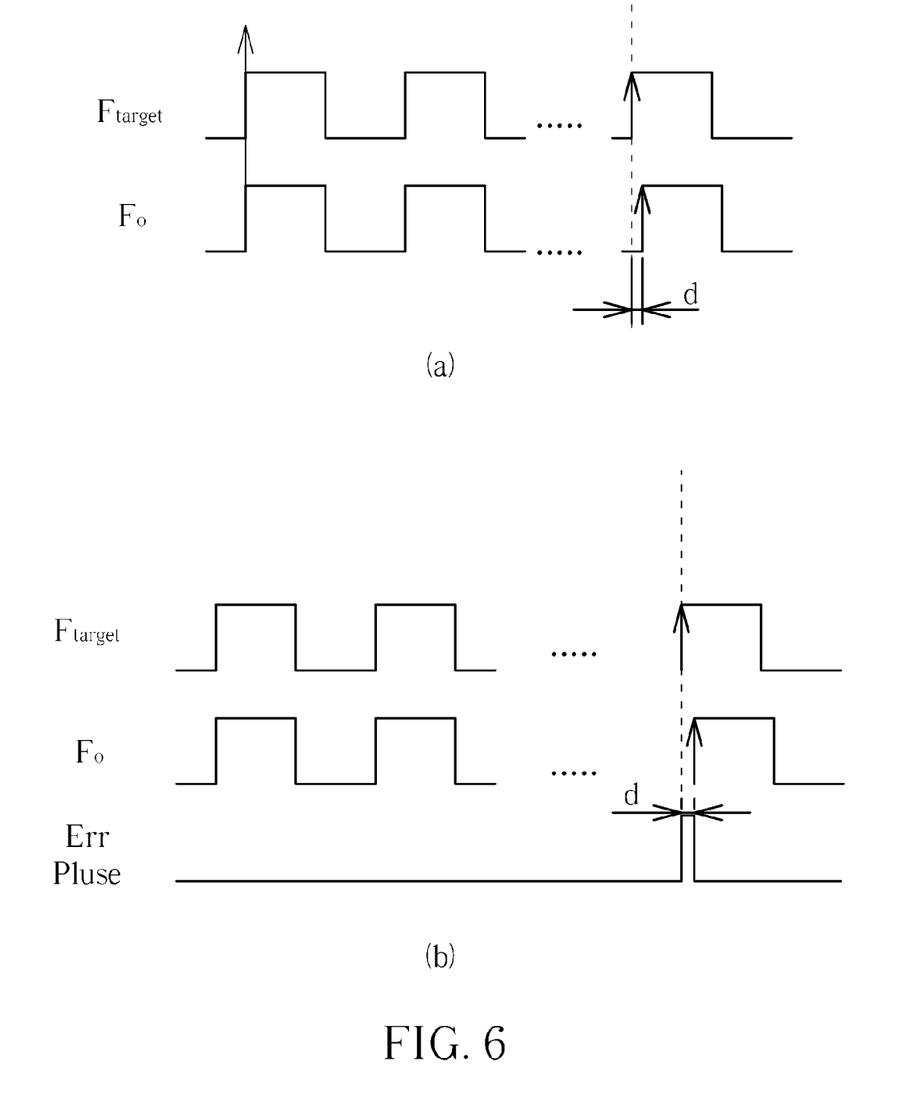

FIGS. 5 and 6 are exemplary embodiments for the frequency detector in the frequency locking circuit shown in FIGS. 2A and 2B. The figure (a) in FIG. 5 utilizes two counters 501, 503 to count the signal with the target frequency $F_{target}$ and the output signal with the output frequency $F_o$, and then the subtractor 505 is utilized to compute the difference. $\text{Count}_{target}$ indicates a counter value of the counter 501, and $\text{Count}_{osc}$ indicates a counter value of the counter 503. The difference between the target frequency $F_{target}$ and the output frequency $F_o$ can be acquired by comparing these two count values. The figure (b) in FIG. 5 utilizes a phase detector 507 detects the signal with the target frequency $F_{target}$ and the output signal with the output frequency $F_o$ to generate the signals $Q_A$ and $Q_B$ indicating the phase relations. After that, the D flip flop 509 is utilized to digitalize the signals $Q_A$ and $Q_B$ from the phase detector 507, to generate signals have only Lead and Lag. The figure (a) in FIG. 6 utilizes the integrator and phase detecting, to find the phase error after a plurality of time periods. The figure (b) in FIG. 6 utilizes the integrator to generate a phase pulse ErrPulse indicating phase difference and utilizes a TDC (time to digital converter) to describe the ErrPulse in a digital form. It should be noted that FIGS. 5 and 6 are only for example but do not mean to limit the scope of the present application. Furthermore, the oscillator shown in FIG. 2 can be a digitally control oscillator, which can be implemented by combining a digital-analog converter to a voltage controlled oscillator. Alternatively, a more accurate digitally-controlled oscillator can be implemented by combining a Sigma-Delta modulator and a digitally-controlled oscillator.

In view of above-mentioned embodiments, the output signal frequency can be rapidly adjusted without adding a pre controllable oscillator gain anticipating circuit and changing the bandwidth. Besides, the oscillator gain can be acquired in the background mode, which means locking the normalization factor during the frequency locking process. Additionally, since the gain of the controllable oscillator is detected in the background mode, the output frequency can rapidly approach to the target frequency, and the drift for oscillator gain can be compensated due to temperature variation. Moreover, the advantage that the loop bandwidth value is fixed is also provided, such that the loop bandwidth can avoid the effect from process variation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency locking method, for locking an output signal outputted from a frequency locking circuit to a target frequency, comprising:
    (a) detecting an output frequency of the output signal, wherein the output signal is generated according to an oscillating frequency of a controllable oscillator;
    (b) computing a frequency difference between the output frequency and the target frequency;
    (c) utilizing a controllable factor adjusting device to provide and to adjust a normalization factor according to the frequency difference, to anticipate a gain of the controllable oscillator and to provide a control signal related with the normalization factor and the frequency difference, wherein the output frequency is related with a product of the normalization factor and the gain of the controllable oscillator; and
    (d) controlling the controllable oscillator according to the control signal, such that the output frequency approaches to the target frequency.

2. The frequency locking method of claim 1, wherein the step (b) successively determines a frequency difference between the adjusted output frequency and the target frequency, and the step (c) successively increases or decreases the normalization factor, such that the product of the normalization factor and the gain of the controllable oscillator successively approaches to a predetermined product, where the output frequency successively approaches the target frequency depending on the successive adjustment of the step (c) and the step (d).

3. The frequency locking method of claim 2, wherein the step (c) comprises:
    increasing or decreasing the normalization factor by a predetermined value, such that the product of the normalization factor and the gain of the controllable oscillator successively approaches to a predetermined product.

4. The frequency locking method of claim 3, wherein the step of decreasing the normalization factor is decreasing a mount having a predetermined ratio to a amount of a previous normalization factor variation, where the step of increasing the normalization factor is increasing a mount having a predetermined ratio to a amount of a previous normalization factor variation.

5. The frequency locking method of claim 4, wherein the predetermined ratio is 1/2.

6. The frequency locking method of claim 2, wherein the step (c) controls the product of the normalization factor and the gain of the controllable oscillator to approach to 1.

7. The frequency locking method of claim 1, further comprising:
    providing a dynamic bandwidth during the frequency locking process.

8. A frequency locking circuit, comprising:
    a controllable oscillator, for generating an oscillating signal;
    a frequency detector, for detecting an output frequency of the output signal and for computing a frequency difference between the output frequency and a target frequency;
    a controllable factor adjusting device, for providing a normalization factor, to anticipate a gain of the controllable oscillator and to provide a control signal related with the normalization factor and the frequency difference, wherein the output frequency is related with a product of the normalization factor and the gain of the controllable oscillator; and
    a controller, for adjusting the normalization factor according to the frequency difference;
    wherein the controllable oscillator adjusts the output frequency according to the control signal and the controller adjusts the normalization factor, such that the output frequency approaches to the target frequency.

9. The frequency locking circuit of claim 8, wherein the frequency detector successively determines the frequency difference between the adjusted output frequency and the target frequency, and the controller controls the controllable factor adjusting device to successively increase or decrease the normalization factor, such that the product of the normalization factor and the gain of the controllable oscillator successively approaches to a predetermined product, thereby the output frequency successively approaches to the target frequency.

10. The frequency locking circuit of claim 9, wherein the controllable factor adjusting device increases or decreases the normalization factor by a predetermined value, such that the product of the normalization factor and the gain of the controllable oscillator successively approaches to a predetermined product.

11. The frequency locking circuit of claim 10, wherein the operation of decreasing the normalization factor is decreasing a mount having a predetermined ratio to a amount of a previous normalization factor variation, where the step of increasing the normalization factor is increasing a mount having a predetermined ratio to a amount of a previous normalization factor variation.

12. The frequency locking circuit of claim 11, wherein the predetermined ratio is 1/2.

13. The frequency locking circuit of claim 9, wherein the controller controls the product of the normalization factor and the gain of the controllable oscillator to approach to 1.

14. The frequency locking circuit of claim 8, further comprising:
    a bandwidth adjusting device, for providing a dynamic bandwidth during the frequency locking process.

15. An oscillator gain anticipating method, comprising:
(a) detecting an output frequency of an output signal, wherein the output signal is generated according to an oscillating frequency of a controllable oscillator;
(b) computing a frequency difference between the output frequency and a target frequency;
(c) utilizing a controllable factor adjusting device to provide a normalization factor, wherein the output frequency is related with a product of the normalization factor and the gain of the controllable oscillator; and
(d) adjusting the normalization factor, and anticipating a gain of the controllable oscillator according to a relation between the normalization factor and the frequency difference.

16. The oscillator gain anticipating method of claim 15, wherein the step (b) successively determines a frequency difference between the adjusted output frequency and the target frequency, and the step (d) successively increases or decreases the normalization factor, such that the product of the normalization factor and the gain of the controllable oscillator successively approaches to a predetermined product, to anticipate the gain of the controllable oscillator.

17. The oscillator gain anticipating method of claim 16, wherein the step (d) comprises:
increasing or decreasing the normalization factor by a predetermined value, such that the product of the normalization factor and the gain of the controllable oscillator successively approaches to a predetermined product.

18. The oscillator gain anticipating method of claim 17, wherein the step of decreasing the normalization factor is decreasing amount having a predetermined ratio to a amount of a previous normalization factor variation, where the step of increasing the normalization factor is increasing a mount having a predetermined ratio to a amount of a previous normalization factor variation.

19. The oscillator gain anticipating method of claim 18, wherein the predetermined ratio is 1/2.

20. The oscillator gain anticipating method of claim 16, wherein the step (d) controls the product of the normalization factor and the gain of the controllable oscillator to approach to 1.

21. An oscillator gain anticipating circuit, comprising:
a controllable oscillator, for generating an oscillating signal;
a frequency detector, for detecting an output frequency of the output signal generated according to the oscillating signal and for computing a frequency difference between the output frequency and the target frequency;
a controllable factor adjusting device, for providing a normalization factor, wherein the output frequency is related with a product of the normalization factor and the gain of the controllable oscillator; and
a controller, for adjusting the normalization factor according to the frequency difference, and for anticipating a gain of the controllable oscillator according to a relation between the normalization factor and the frequency difference.

22. The oscillator gain anticipating circuit of claim 21, wherein the frequency detector successively determines a frequency difference between the adjusted output frequency and the target frequency, and the controller controls controllable factor adjusting device to successively increase or decrease the normalization factor, such that the product of the normalization factor and the gain of the controllable oscillator successively approaches to a predetermined product, to anticipate the gain of the controllable oscillator.

23. The oscillator gain anticipating circuit of claim 22, wherein the controllable factor adjusting device increases or decreases the normalization factor by a predetermined value, such that the normalization factor approaches to a reciprocal of the gain of the controllable oscillator.

24. The oscillator gain anticipating circuit of claim 23, wherein the operation of decreasing the normalization factor is decreasing a mount having a predetermined ratio to a amount of a previous normalization factor variation, where the step of increasing the normalization factor is increasing a mount having a predetermined ratio to a amount of a previous normalization factor variation.

25. The oscillator gain anticipating circuit of claim 24, wherein the predetermined ratio is 1/2.

26. The oscillator gain anticipating circuit of claim 21, wherein the controller controls the product of the normalization factor and the gain of the controllable oscillator to approach to 1.

* * * * *